United States Patent
Lim

(10) Patent No.: US 7,598,553 B2
(45) Date of Patent: Oct. 6, 2009

(54) CMOS IMAGE SENSOR AND METHOD OF MANUFACTURING THEREOF

(75) Inventor: Keun Hyuk Lim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 147 days.

(21) Appl. No.: 11/948,783

(22) Filed: Nov. 30, 2007

(65) Prior Publication Data

US 2008/0157143 A1    Jul. 3, 2008

(30) Foreign Application Priority Data

Dec. 29, 2006    (KR) .................. 10-2006-0137342

(51) Int. Cl.
*H01L 31/113* (2006.01)
*H01L 21/00* (2006.01)

(52) U.S. Cl. ............................. 257/292; 257/E27.133; 438/73

(58) Field of Classification Search .......... 257/59, 257/72, 225, 228, 229, 233, 291, 292, 257, 257/258, 443, 444, 446, E27.13, E27.133, 257/E31.063, E31.084, E31.119, E31.124; 438/73

See application file for complete search history.

(56) References Cited

U.S. PATENT DOCUMENTS

2007/0152247 A1* 7/2007 Lee .......................... 257/291
2008/0128768 A1* 6/2008 Kao .......................... 257/292

* cited by examiner

*Primary Examiner*—Victor Mandala
*Assistant Examiner*—Scott Stowe
(74) *Attorney, Agent, or Firm*—Workman Nydegger

(57) ABSTRACT

A CMOS image sensor comprising an epitaxial layer formed on a semiconductor layer, a device isolating layer formed on the epitaxial layer in order to divide the isolating layer into an active region and a device isolating region, the active region including a photo diode region and a transistor region, a drive transistor including a gate electrode formed on the epitaxial layer and a gate spacer formed on both side walls of the gate electrode, a floating diffusion region formed on the epitaxial layer, a trench hole formed in the device isolating layer and epitaxial layer in an area between the photo diode region and the floating diffusion region, a poly wiring formed in the trench hole which extends from the gate electrode of the drive transistor to the photo diode region or the floating diffusion region, and an impurity diffusion region formed by ion implanting the epitaxial layer on the side of the gate spacer.

14 Claims, 4 Drawing Sheets

CMOS IMAGE SENSOR AND METHOD OF MANUFACTURING THEREOF

CROSS-REFERENCES AND RELATED APPLICATIONS

This application claims the benefit of Korean Patent Application No. 10-2006-0137342, filed on Dec. 29, 2006, which is hereby incorporated by reference in its entirety.

BACKGROUND OF THE INVENTION

1. Field of the Invention

The present invention relates to a CMOS image sensor. More particularly, the present invention relates to a CMOS image sensor and a method of manufacturing the same wherein the wiring for electrically connecting the floating diffusion region and drive transistor of the image sensor is simplified.

2. Discussion of the Related Art

An image sensor is a device which is used for converting an optical image into an electrical signal. Typically, the image sensors currently used in the art are either complementary metal-oxide-silicon (CMOS) image sensors or charge coupled device (CCD) image sensors.

The CCD image sensor has excellent photo sensitivity and noise characteristics, but is difficult to incorporate in highly integrated devices and has a relatively high power consumption rate compared to the CMOS image sensor. The CMOS image sensor, on the other hand, has simpler processes and a lower power consumption rate, making it more suitable in highly integrated devices.

Recently, a technique for manufacturing a semiconductor device has been developed, wherein the CMOS image sensor has improved characteristics. Because of these developments, there has been a lot of interest in CMOS image sensors.

Generally, the CMOS image sensor comprises photodiodes capable of receiving light and transistors capable of controlling image signals input from the photodiodes. The CMOS image sensor is either a three T-type or a four T-type, depending on the number of transistors. Here, the three T-type sensor is includes one photo diode and three transistors, and the four T-type has one photo diode and four transistors.

A four T-type CMOS image sensor of the related art is illustrated in FIG. 1, and comprises a photo diode region (PD) formed at in an active region 1, at the portion of the active region 1 having the widest area. The image sensor also includes a transfer transistor (Tx), a reset transistor (Rx) and a drive transistor (Dx) formed so as to overlap with the active region 1 in a region other than the photo diode region (PD).

FIG. 2 illustrates the layers of the CMOS image sensor. The CMOS sensor comprises a P type epitaxial layer 4 is formed on a P++ type semiconductor substrate 2. Additionally the sensor includes a device isolating layer 6, a gate electrode 10, a gate oxide film 12 and a gate spacer 14, an n– type diffusion region 16, an n+ type diffusion region 18, an inter-layer dielectric layer 26, first and second contact holes 20 and 30, first and second contact plugs 22 and 32, and a metal wiring 24.

A device isolating layer 6 is formed in the device isolating region of the semiconductor substrate 2 at a location where the photo diode region (PD), the active region 1, and the device isolating region are located.

The gate electrode 10 is formed on a gate isolating layer 8 formed on the expitaxial layer 4 so as to form the transfer transistor (Tx) and the drive transistor (Dx). The gate oxide film 12 and the gate spacer 14 are formed on both walls of the gate electrode 10.

A n– type diffusion region 16 is formed in the epitaxial layer 4 of the photo diode region (PD). While a n+ type diffusion region 18 is formed at the active region 1 between the respective transistors (Tx, Rx, Dx).

An inter-layer dielectric layer 26 is formed on the epitaxial layer 4 in order to cover the gate electrode 10 including the gate spacer 14, and a first contact hole 20 is formed so as to penetrate through the inter-layer dielectric layer 26 in order to expose a floating diffusion region (FD). A second contact hole is formed so as to penetrate through the inter-layer dielectric layer 26 in order to expose the gate electrode 10 of the driver transistor (Dx). First and second contact plugs 22 and 32 are formed in the first and second contact holes 20 and 30 of the inter-layer dielectric layer 26, and metal wiring 24 is formed on the first and second contact plugs 22 and 32 in order to electrically connect the floating diffusion region (FD) and the gate electrode 10 of the driver transistor (Dx).

The photo diode (PD) senses incident light to generate charges in the sensor depending on the quantity of light. The transfer transistor (Tx) transfers the charges generated from the photo diode (PD) to the floating diffusion region (FD). Before the charges are transferred, the floating diffusion region (FD) moves electrons from the photo diode (PD) to the reset transistor (Rx) in order to turn the reset transistor on. Then, the floating diffusion region (FD) is set at a predetermined low-charge level. The reset transistor (Rx) discharges the charges stored in the floating diffusion region (FD) in order to detect a signal. The drive transistor (Dx) converts the charges into a voltage signal. Typically, metal wiring is used in order to connect the floating diffusion region (FD) and the drive transistor (Dx).

In comparison to the four T-type CMOS image sensor, a three T-type CMOS image sensor known in the related art is shown in FIG. 3. The tree T-type CMOS image sensor comprises a photo diode region (PD) formed at the widest portion of an active region, a reset transistor (Rx), and a drive transistor (Dx) formed to be overlapped with the active region in an area other than the photo diode region (PD). In the three T-type CMOS image sensors, metal wiring is used to electrically connect the photo diode (PD) and the drive transistor (Dx).

The metal wiring 40 is electrically connected to the various components by a first contact plug and a second contact plug (not shown). The first contact plug is formed in a first contact hole 42 wherein the gate electrode of the drive transistor (Dx) is exposed, and the second contact plug is formed in the second contact hole 44 where the photo diode (PD) is exposed.

Using these configurations, the three T-type and four T-type image sensors convert the charges generated from the photo diode region (PD) into a voltage signal at the drive transistor (Dx). Here, the metal wirings 24 and 40 are used in order to electrically connect the photo diode (PD) or the floating diffusion region (FD) and the drive transistor (Dx).

One difficulty in producing the CMOS image sensor of the related art is that manufacturing the metal wirings is complicated. Additionally, there is insufficient space for forming additional metal wirings for connecting additional components, such as a peripheral transistor without increasing the number of layers in the CMOS sensor.

BRIEF SUMMARY OF THE INVENTION

The present invention proposes to solve the foregoing problems by providing a method of manufacturing a CMOS image sensor with a reduced number of layers by simplifying the wiring in the sensor which electrically connects the floating diffusion region and a drive transistor.

In order to accomplish the above object, one aspect of the invention is a CMOS image sensor comprising an epitaxial layer formed on a semiconductor layer, a device isolating layer formed on the epitaxial layer in order to divide the epitaxial layer into an active region and a transistor region, the active region including a photo diode region, a drive transistor including a gate electrode formed on the epitaxial layer and a gate spacer formed on both side walls of the gate electrode, a floating diffusion region formed on the epitaxial layer, a trench hole formed in the device isolating layer and the epitaxial layer between the photo diode region and the floating diffusion region, a poly wiring formed in the trench hole which extends from the gate electrode of the drive transistor to the photo diode region or the floating diffusion region, and an impurity diffusion region formed by ion implanting the epitaxial layer on the sides of the gate spacer.

In order to accomplish the above configuration, another aspect of the invention is a method for fabricating a the CMOS image sensor, the method comprising forming an epitaxial layer on a semiconductor layer, forming a device isolating layer on the epitaxial layer in order to divide the epitaxial layer into an active region and a device isolating region, the active region including a photo diode region and a transistor region, forming a trench hole in the device isolating layer and the epitaxial layer between the photo diode region and the floating diffusion region, forming a gate electrode in a drive transistor region on a gate isolating layer on the epitaxial layer, forming a poly wiring in the trench hole which extends from the gate electrode and directly connect the gate electrode to the photo diode region or the floating diffusion region, forming a gate spacer on the side walls of the gate electrode, and forming an impurity diffusion region by ion implanting the epitaxial layer on each side of the gate spacer.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Other objects and features other than the above object of the present invention will be obvious through the description for embodiments with reference to accompanying drawings.

Preferable embodiments of the present invention will be described with reference to FIGS. 4 to 8.

Figure 1:
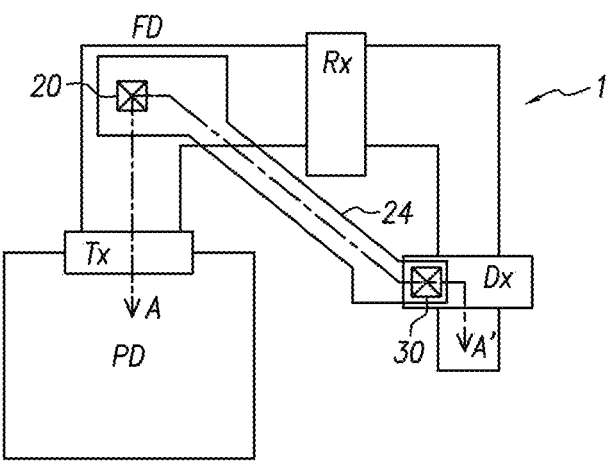
FIG. 1 is a plan view showing a four T-type CMOS image sensor according to the related art.
Figure 2:
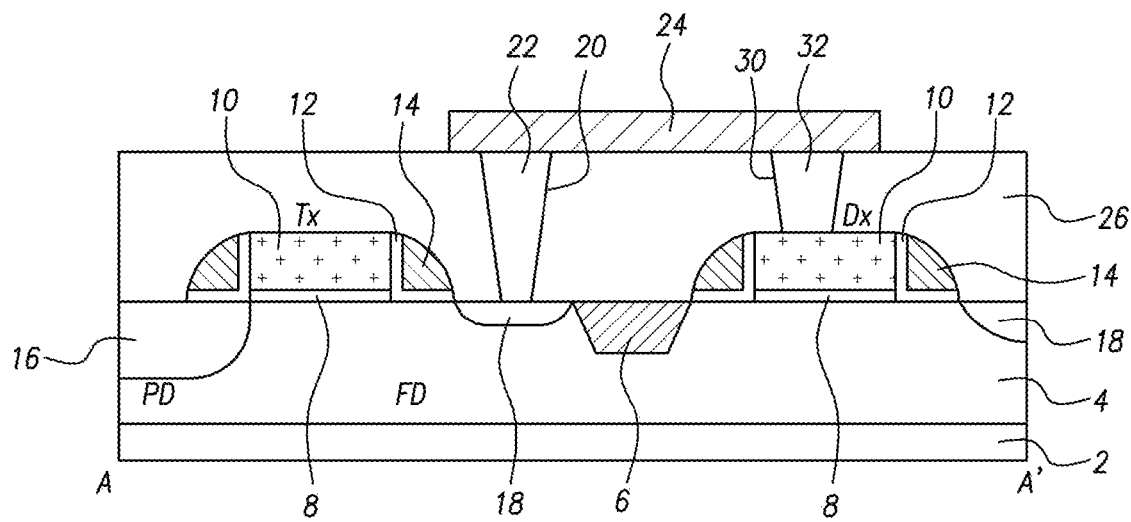
FIG. 2 is a cross-sectional view of the CMOS image sensor taken along the A-A' line shown in FIG. 1.
Figure 3:
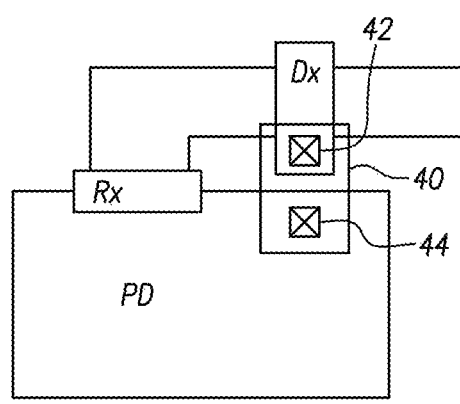
FIG. 3 is a plan view showing a three T-type CMOS image sensor according to the related art.
Figure 4:
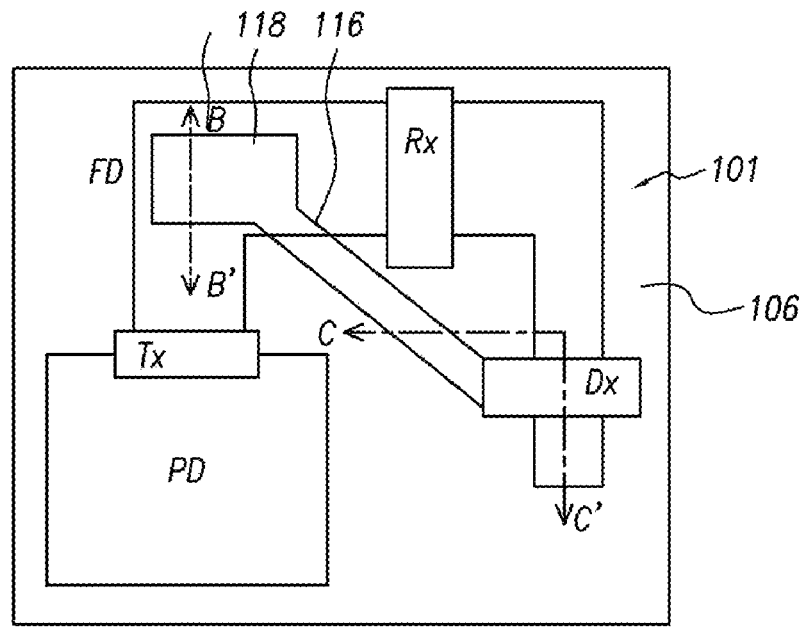
FIG. 4 is a plan view showing a CMOS image sensor according to a first embodiment of the present invention.
Figure 5:
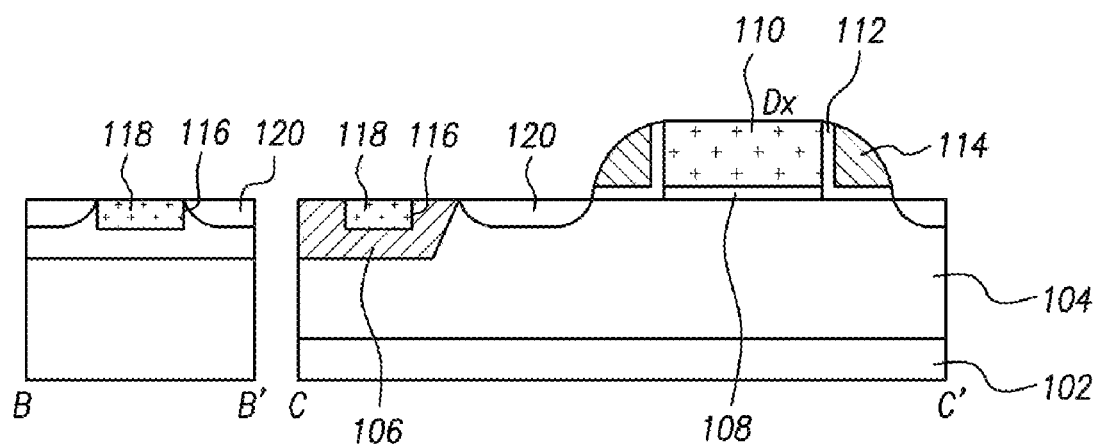
FIG. 5 is a cross-sectional view of the CMOS image sensor taken along the B-B' and C-C' lines shown in FIG. 4.

FIG. 4 is a plan view showing a CMOS image sensor according to a first embodiment of the present invention, and FIG. 5 is a cross-sectional view of the CMOS image sensor taken along the B-B' and C-C' lines shown in FIG. 4.

Referring to FIGS. 4 and 5, in a four T-type CMOS image sensor according to an embodiment of the present invention, a trench hole 116 is formed in a floating diffusion region FD and device isolating layer 106 in order to connect the floating diffusion region (FD) and a drive transistor (Tx) Then, poly wiring 118 filled in the trench hole 116 while the gate electrodes of the respective transistors (Tx, Rx, Dx) are formed.

The four T-type CMOS image sensor of the present invention comprises a photo diode region (PD), a transfer transistor (Tx), a drive transistor (Dx), a reset transistor (Rx), a floating diffusion region (FD), a P type epitaxial layer 104, a device isolating layer 106, a trench hole 116, a gate electrode 110, a poly wiring 118, a gate oxide film 112 and a gate spacer 114, and an n+ diffusion region (120).

The photo diode region (PD) is capable of sensing light and is formed in a portion of the active region 101 with a large area.

The transfer transistor (Tx) is formed so as to overlap with the active region 101 and the photo diode region, and is capable of transferring charges generated from the photo diode to the floating diffusion region (FD). The drive transistor (Dx) is connected to the floating diffusion region (FD) and is capable of converting the charges from the photo diode region (PD) into a voltage signal. The reset transistor (Rx) discharges the charges stored in the floating diffusion region (FD). The floating diffusion region (FD) is positioned between the transfer transistor (Tx) and the reset transistor (Rx), and is capable of storing the charges from the photo diode region (PD) in a predetermined low charge state.

A P type epitaxial layer 104 is formed on a P++ type semiconductor substrate 102.

The device isolating layer 106 is formed in the device isolating region of the semiconductor substrate 102 where the photo diode region (PD), the active region 101, and the device isolating region are located.

The trench hole 116 is formed on the device isolating layer 106 and the epitaxial layer 104 between the floating diffusion region (FD) and the drive transistor (Dx).

The gate electrode 110 for the drive transistor (Dx) is formed on a gate insulating layer 106 on the epitaxial layer 104.

The poly wiring 118 is formed simultaneously with the gate electrode 110 in the trench hole 116 so as to electrically connect the floating diffusion region (FD) and the drive transistor (Dx). A gate oxide film 112 and gate spacer 114 are formed on each side wall of the gate electrode 110.

A n+ type diffusion region 120 is formed in the active region 101 between the respective transistors (Tx, Rx, Dx).

Figure 6A:
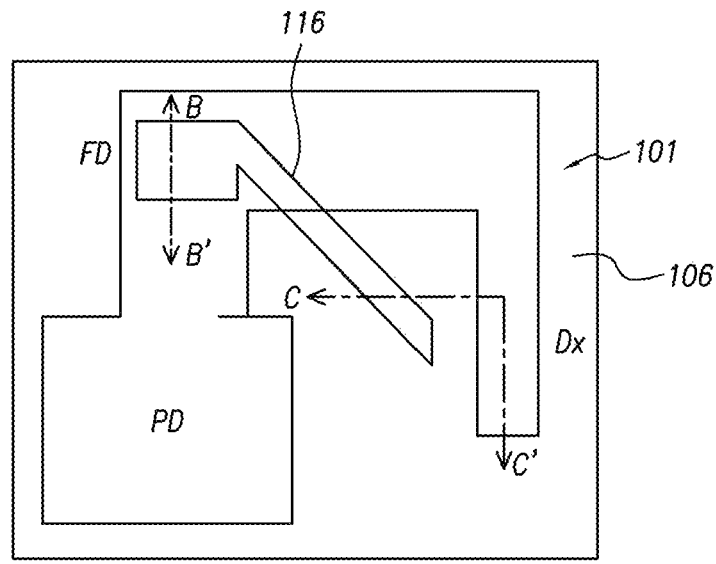
FIGS. 6a to 6d are drawings showing a method of manufacturing of the CMOS image sensor shown in FIG. 4.
Figure 6B:
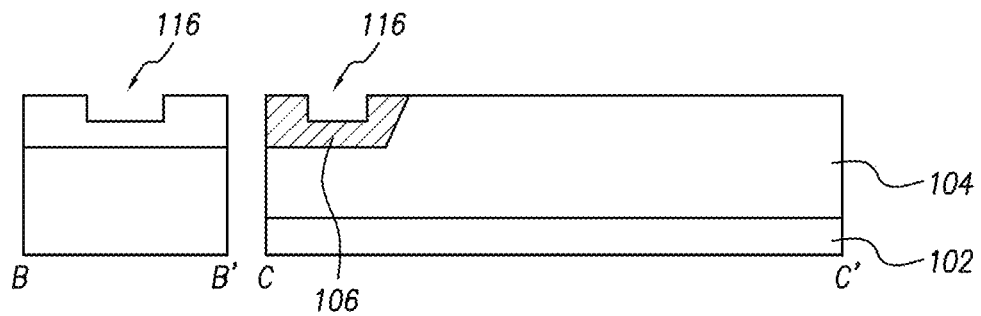

A method of manufacturing of the CMOS image sensor described above will now be described with reference to FIGS. 6A to 6D. First, as shown in FIGS. 6A and 6B, an epitaxial process is performed on a high-concentration P++ type semiconductor substrate 102 in order to form a lowconcentration P type epitaxial layer 104. Here, the epitaxial layer 104 forms a depletion region in the photo diode region that is large and deep in order to increase the ability of a low voltage photo diode (PD) to collect photo charges in order to increase photo sensitivity.

Then, the semiconductor substrate 102 is divided into an active region 101 and a device isolating region, and a device isolating layer 106 is formed in the device isolating region using a shallow trench isolation (STI) process or a local oxidation of silicon (LOCOS) process.

Next, a patterning process is performed on the epitaxial layer 104 in which the device isolating layer 106 is formed, by using a mask during a photo lithography process in order to form a trench hole 116 which electrically connects the floating diffusion region (FD) and drive transistor (Dx). Here, the trench hole 116 is also formed on the device isolating layer 106 in the area between the floating diffusion region (FD) and the drive transistor (Dx). The trench hole (11) is formed at the same thickness as a gate electrode 110 described below, that is, the depth of 0.15 to 0.2 μm.

Figure 6C:
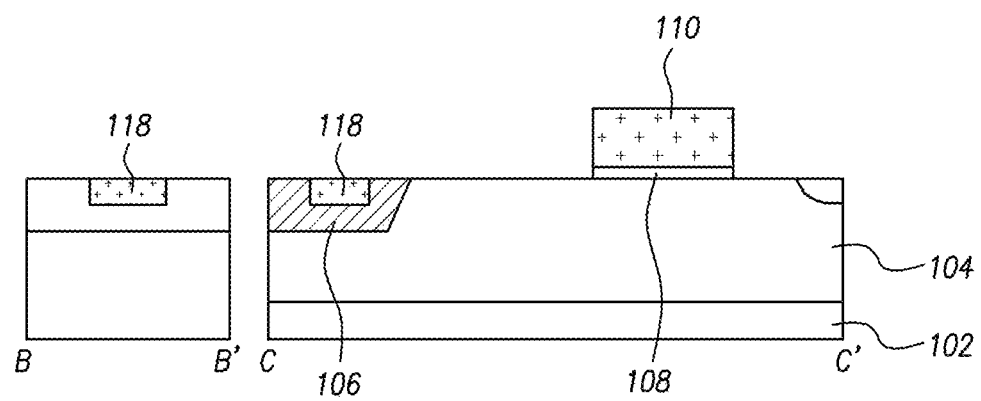

Subsequently, as shown in FIG. 6C, a gate isolating layer 108 and a gate electrode 110 are formed on the epitaxial layer 104, and a poly wiring 118 is formed in the trench hole 116. More specifically, a gate isolating layer and a gate metal layer are sequentially formed on the epitaxial layer 104 using a deposition method. Here, a gate metal layer is also formed in the trench hole 116 in order to form the poly wiring 118. At this time, the poly wiring 118 is formed of the same poly silicon as the gate electrode 110, and extends from the gate electrode 110. Accordingly, the silicon in the floating diffusion region and the poly silicon of the poly wiring 118 are connected via a direct electrical connection.

Next, the gate isolating layer and the gate metal layer are formed into a predetermined pattern during a photolithography process using a mask in order to form a gate isolating layer 108 and gate electrode 110.

Figure 6D:
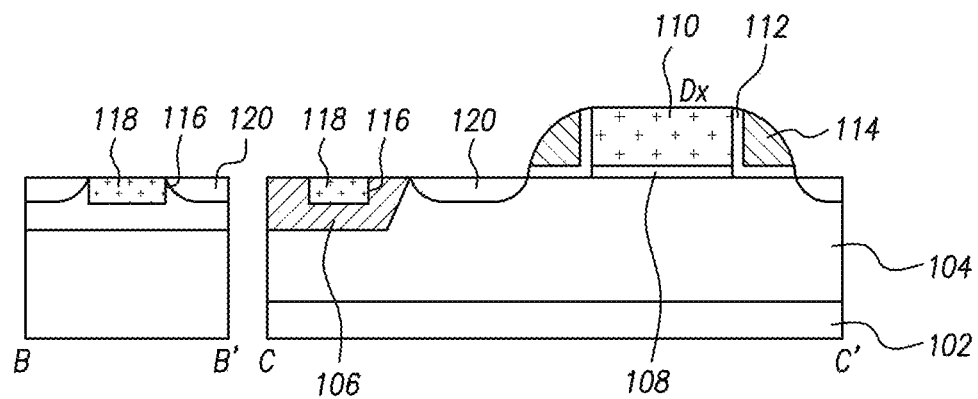

Then, as shown in FIG. 6D, a gate oxide film 112 and a gate spacer 114 are formed on both side walls of the gate electrode 110. More specifically, after depositing a gate oxide film over the epitaxial layer 104 and gate electrode 110, a patterning is performed using a photolithography process and a dry etching process to form the gate oxide film 112. Then, the gate oxide film 112 formed on the upper of the gate electrode 110 is removed during a dry etching process so that the upper surface of the gate electrode 110 is exposed.

Subsequently, after forming an isolating layer on the gate electrode 110 and gate oxide film 112, an etch back process is performed to form the gate spacer 114 on both side walls of the gate electrode 110.

Next, n+ type impurity ions are implanted into the epitaxial layer 104 of both sides of the gate spacer 114 in order to form an n+ type diffusion region 120.

As described above, in the present invention the trench hole 116 is formed on the device isolating layer 106 and epitaxial layer 104, and the poly wiring 118 is formed so as to extend from the gate electrode 110. The poly wiring 118 is formed during the same process used to form the gate electrode 110 in the trench hole 116.

Because it is not necessary to use an additional set of wirings to electrically connect the floating diffusion region (FD) and the drive transistor (Dx), the present invention has a simpler wiring pattern than the related art, with a reduced number of layers.

Figure 7:
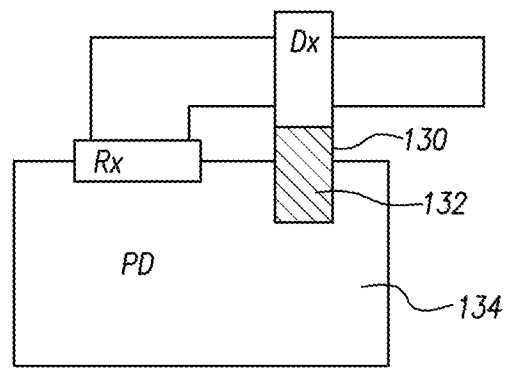
FIG. 7 is a plan view showing a CMOS image sensor according to a second embodiment of the present invention.

A similar method may also be applied to a three T-type CMOS image sensor, such as the one shown in FIG. 7. FIG. 7 shows in the three T-type CMOS image sensor according to a second embodiment of the present invention, wherein a trench hole 130 is formed in the device isolating layer 134 and photo diode region (PD) in order to connect the photo diode region (PD) and the drive transistor (Dx). Poly wiring 132 is formed during the process used to form the gate electrodes and fills the trench hole 130.

Figure 8:
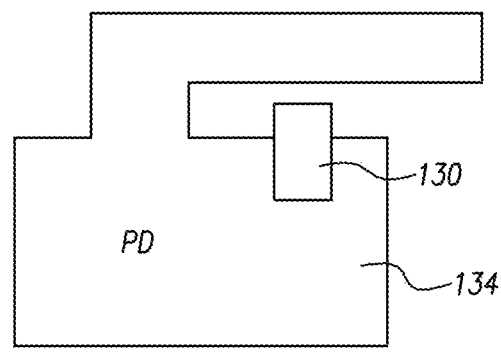
FIG. 8 is a plan view showing the method of manufacturing of the CMOS image sensor shown in FIG. 6.

A method of manufacturing such a three T-type CMOS image sensor is shown in FIG. 8. During this method, a trench hole 130 is formed on an epitaxial layer (not shown) wherein a device isolating layer 134 is formed. This trench hole 130 is formed in the region between the floating diffusion region (FD) and the drive transistor (Dx) by performing a patterning process using a photolithography process with a mask. At this time, the trench hole 130 is formed to be partially overlapped with a photo diode region (PD). The trench hole 130 is formed with the same thickness as the gate electrodes of the respective transistors (Rx, Dx), that is, at a depth of between 0.15 and 0.2 μm.

Next, when forming the gate electrodes of the respective transistors (Rx, Dx), poly wiring 130 is formed in the trench hole, so as to extend from the gate electrode of the drive transistor (Dx). In this example, the poly wiring is formed of the same poly silicon as the gate electrode, the poly silicon being directly connected to the silicon of the photo diode (PD).

The subsequent process for manufacturing the transistor is the same the process described in the first embodiment so the description will be omitted.

As described above, in the present invention, the trench hole 130 is formed on the device isolating layer 134 and the photo diode region (PD), and poly wiring 132 is connected to the gate electrode. The poly wiring 132 is formed in the same process used to form the gate electrode in the trench hole 130.

Since it is not necessary to use additional wiring to electrically connect the photo diode region (PD) and the drive transistor (Dx), the present invention can simplify the wiring and reduce the number of layers in the CMOS image sensor.

It should be noted that although the technical idea of the present invention has been described in detail according to the preferable embodiments, the embodiments are included in order to describe the present invention, rather than limit the scope of the invention. In addition, it can be understood by those skilled in the art that various variations can be made, without departing from the scope or idea of the present invention.

As described above, in the CMOS image sensor and the method of manufacturing the same, a trench hole is formed and filed with poly wiring extending from the gate electrode which can be formed during the same process used to form the gate electrode of the drive transistor. The wiring connects the floating diffusion (FD) or the photo diode region (PD) and the drive transistor (Dx).

In the present invention, it is not necessary to add separate wirings in order to electrically connect the floating diffusion region (FD) or the photo diode region (PD) and the drive transistor (Dx), so the wiring of the CMOS image sensor can be simplified and the number of layers can be reduced.

Also, in the present invention, a fixture or a structure for separately connecting the components is not required, meaning that the structure of the CMOS image sensor can be simplified.

What is claimed is:

1. A CMOS image sensor comprising:
    an epitaxial layer formed on a semiconductor layer;
    a device isolating layer formed on the epitaxial layer which divides the epitaxial layer into an active region and a device isolating region, the active region including a photo diode region and a transistor region;

a drive transistor including a gate electrode with side walls which is formed on the epitaxial layer and a gate spacer formed on both side walls of the gate electrode;

a floating diffusion region formed on the epitaxial layer;

a trench hole formed in the device isolating layer and the epitaxial layer between the photo diode region and the floating diffusion region;

a poly wiring formed in the trench hole which extends from the gate electrode of the drive transistor to the photo diode region or the floating diffusion region; and an impurity diffusion region formed by ion implanting a dopant in the epitaxial layer on the side of the gate spacers formed on the side walls of the gate electrode.

2. The CMOS image sensor according to claim 1, wherein the trench hole is formed at the depth of between 0.15 and 0.2 µm.

3. The CMOS image sensor according to claim 1, wherein the trench hole is formed so as to partially overlap with the photo diode region or the floating diffusion region.

4. The CMOS image sensor according to claim 1, wherein the dopant for forming the impurity diffusion region is an n+ type dopant.

5. The CMOS image sensor according to claim 1, further comprising a gate oxide film formed between the gate electrode and the gate spacer.

6. A method of fabricating of a CMOS image sensor comprising:

forming an epitaxial layer on a semiconductor layer;

forming a device isolating layer for dividing the epitaxial layer into an active region and a device isolating region, the active region including a photo diode region and a transistor region;

forming a trench hole in the device isolating layer and epitaxial layer between the photo diode region and the floating diffusion region;

forming a gate electrode with side walls on a gate isolating layer in a drive transistor region on the epitaxial layer;

forming a poly wiring in the trench hole which extends from the gate electrode to the photo diode region or the floating diffusion region;

forming a gate spacer on both side walls of the gate electrode; and forming an impurity diffusion region by implanting ions into the epitaxial layer on the side of the gate spacers formed on the side walls of the gate electrode.

7. The method of fabricating of the CMOS image sensor according to claim 6, wherein the poly wiring is formed at the same time as the gate electrodes.

8. The method of fabricating of the CMOS image sensor according to claim 6, wherein the trench hole is formed at the depth of between 0.15 and 0.2 µm.

9. The method of fabricating of the CMOS image sensor according to claim 6, wherein the trench hole is formed so as to partially overlap the photo diode region or the floating diffusion region.

10. The method of fabricating of the CMOS image sensor according to claim 6, further comprising forming a gate oxide film between the gate electrode and the gate spacer.

11. The method of fabricating of the CMOS image sensor according to claim 6, wherein the impurity diffusion region is formed by ion implanting an n+ type dopant into the epitaxial layer on the sides of the gate spacers.

12. A CMOS image sensor comprising:

an epitaxial layer formed on a semiconductor layer;

a device isolating layer formed on the epitaxial layer which divides the epitaxial layer into an active region and a device isolating region, the active region including a photo diode region and a transistor region;

a drive transistor including a gate electrode with side walls which is formed on the epitaxial layer, a gate oxide film formed on both walls of the gate electrode, and a gate spacer formed on the gate oxide film;

a floating diffusion region formed on the epitaxial layer;

a trench hole formed in the device isolating layer and the epitaxial layer between the photo diode region and the floating diffusion region, the trench hole partially overlapping the photo diode region or the floating diffusion region;

a poly wiring formed in the trench hole which extends from the gate electrode of the drive transistor to the photo diode region or the floating diffusion region; and an impurity diffusion region formed by ion implanting a dopant in the epitaxial layer on the side of the gate spacers formed on the side walls of the gate electrode.

13. The CMOS image sensor according to claim 12, wherein the dopant for forming the impurity diffusion region is an n+ type dopant.

14. The CMOS image sensor according to claim 12, wherein the trench hole is formed at the depth of between 0.15 and 0.2 µm.

* * * * *